(12) United States Patent
Jeong et al.

(10) Patent No.: US 10,672,799 B2
(45) Date of Patent: Jun. 2, 2020

(54) DISPLAY DEVICE AND MANUFACTURING METHOD THEREOF

(71) Applicant: Samsung Display Co. Ltd., Yongin-si, Gyeonggi-do (KR)

(72) Inventors: Yu Gwang Jeong, Anyang-si (KR); Su Bin Bae, Gyeongsan-si (KR); Hyun Min Cho, Hwaseong-si (KR); Sang Gab Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/465,154

(22) Filed: Mar. 21, 2017

(65) Prior Publication Data

US 2017/0278867 A1 Sep. 28, 2017

(30) Foreign Application Priority Data

Mar. 22, 2016 (KR) .................. 10-2016-0034130

(51) Int. Cl.
*H01L 51/50* (2006.01)
*H01L 29/786* (2006.01)
*H01L 27/12* (2006.01)

(52) U.S. Cl.
CPC ........ *H01L 27/124* (2013.01); *H01L 27/1248* (2013.01); *H01L 27/1288* (2013.01)

(58) Field of Classification Search
None
See application file for complete search history.

(56) References Cited

U.S. PATENT DOCUMENTS

| 4,581,267 | A | * | 4/1986 | Miller | G03C 11/08 428/40.6 |
|---|---|---|---|---|---|
| 8,436,528 | B2 | | 5/2013 | Gregory et al. | |
| 8,836,214 | B2 | | 9/2014 | Gregory et al. | |
| 2004/0012028 | A1 | * | 1/2004 | Park | H01L 27/3244 257/88 |
| 2005/0046346 | A1 | * | 3/2005 | Tsuchiya | H01L 27/3244 313/509 |
| 2007/0103063 | A1 | * | 5/2007 | Kim | H01L 27/3244 313/504 |
| 2008/0169470 | A1 | * | 7/2008 | Lim | H01L 27/1214 257/59 |
| 2015/0021564 | A1 | | 1/2015 | Hong et al. | |

(Continued)

FOREIGN PATENT DOCUMENTS

| KR | 10-2008-0040772 A | 5/2008 |
|---|---|---|
| KR | 10-2008-0069745 A | 7/2008 |

(Continued)

*Primary Examiner* — Charles D Garber
*Assistant Examiner* — Xiaoming Liu
(74) *Attorney, Agent, or Firm* — Innovation Counsel LLP

(57) ABSTRACT

A display device may include a substrate, an active pattern layer, a gate insulating layer, a first metal pattern layer, an interlayer insulating layer, a second metal pattern layer, and a passivation film. The active pattern layer may be disposed on the substrate. The gate insulating layer may be disposed on the active pattern layer. The first metal pattern layer may be disposed on the gate insulating layer. The interlayer insulating layer may be disposed on the first metal pattern layer. The second metal pattern layer may be disposed on the interlayer insulating layer. The passivation film may be disposed on the side wall of the second metal pattern layer.

6 Claims, 13 Drawing Sheets

(56) References Cited

U.S. PATENT DOCUMENTS

2015/0034942 A1* 2/2015 Kim .................... H01L 29/7869
257/43
2015/0102336 A1* 4/2015 Kang .................. H01L 27/1225
257/43

FOREIGN PATENT DOCUMENTS

KR    10-2015-0011433 A    2/2015
WO       2007/023272 A1    3/2007

* cited by examiner

DISPLAY DEVICE AND MANUFACTURING METHOD THEREOF

This application claims priority to Korean Patent Application No. 10-2016-0034130 filed on Mar. 22, 2016 in the Korean Intellectual Property Office; the disclosure of the Korean Patent Application is incorporated herein by reference in its entirety.

BACKGROUND

1. Field

The technical field relates to a display device and a manufacturing method for manufacturing the display device.

2. Description of the Related Art

A display device, such as an organic light-emitting diode display (OLED) or a liquid crystal display device (LCD), includes a display area and a pad area. The display area is provided with an electro-optical active layer, such as an organic light-emitting layer or a liquid crystal layer; the pad area is provided with connection pads for connecting with an external circuit, such as a drive chip, and island pads.

When forming a protective layer and an anode electrode on a substrate of the display device, in the display area, a portion of the protective layer is disposed between a data line and the anode electrode, whereas in the pad area, a portion of the protective layer is removed because the data line should be exposed in order to contact an external drive chip.

Therefore, the data line makes direct contact with a metal layer including the anode electrode, and metal ions contained in the anode electrode are reduced by a galvanic reaction with metal contained in the data line during a wet etching process of forming the anode electrode. As a result of the galvanic reaction, aluminum (Al) may be undesirably contained in the data line, and silver (Ag) may be undesirably contained in the anode electrode.

Further, when an electric field is generated between pads by a driving power source, metal particles formed on the lateral surfaces of the data lined associated with the pads are abnormally grown and may cause shorting of the pads. This phenomenon may cause abnormal driving of the display device.

SUMMARY

An embodiment may be related to a display device in which a passivation film is formed in a pad area.

An embodiment may be related to a method of manufacturing display device, e.g., a liquid crystal display device, in which a passivation film is formed in a pad area.

According to an embodiment, a display device may include the following elements: a substrate; an active pattern layer disposed on the substrate; a gate insulating layer disposed on the active pattern layer; a first metal pattern layer disposed on the gate insulating layer; an interlayer insulating layer disposed on the first metal pattern layer; a second metal pattern layer disposed on the interlayer insulating layer; and a passivation film disposed on the side wall of the second metal pattern layer.

According to an embodiment, a display device may include the following elements: a substrate; a metal pattern layer disposed on the substrate; and a passivation film disposed on the side wall of the metal pattern layer and containing a fluorine-based material, the passivation film exposing at least a part of the metal pattern layer.

According to an embodiment, a method of manufacturing a display device, including a planar pixel area and a planar pad area, may include the following steps: forming an active pattern layer on a substrate of the pixel area; forming a gate insulating layer on the active pattern layer and the substrate of the pad area; forming a first metal pattern layer on the gate insulating layer; forming an interlayer insulating layer on first metal pattern layer; forming a second metal pattern layer on the interlayer insulating layer; and forming a passivation film on the side wall of the second metal pattern layer using a fluorine-based gas.

An embodiment may be related to a display device. The display device may include a substrate, a transistor, a metal line, a metal pad, and a first passivation film. The transistor may overlap a face of the substrate. The metal line may include a line portion formed of a first metal material. The metal pad may include a pad portion formed of the first metal material, may be electrically connected through the metal line to the transistor, and may be wider than the metal line in a first direction. The first direction may be parallel to the face of the substrate. A first face of the metal pad may be oriented at a first acute angle or a right angle with respect to the face of the substrate. The first passivation film may be formed of an insulating material and may directly contact the first face of the metal pad.

The display device may include a passivation layer. The passivation layer may be formed of the insulating material and may directly contact the metal line.

The display device may include an electrode and a protective layer. The protective layer may electrically insulate the electrode from the metal line and may directly contact the second passivation film. A reduction potential of a material of the electrode may be unequal to a reduction potential of the first metal material. The protective layer may not directly contact the first passivation film.

The insulating material may include or may be a fluorine-based polymer.

The insulating material may include or may be at least one of a fluorocarbon ($C_xF_y$) group material and a fluorohydrocarbon ($C_xB_yF_z$) group material.

A first face of the first passivation film may be oriented at the first acute angle or the right angle with respect to the face of the substrate.

A first face of the first passivation film may be oriented at the first acute angle with respect to the face of the substrate. A second face of the first passivation film may be opposite the first face of the first passivation film and may be oriented at a second acute angle with respect to the face of the substrate. A size of the second acute angle may be unequal to a size of the first acute angle.

The first face of the first passivation film may be positioned between the metal pad and the second face of the first passivation film. The second acute angle may be greater than the first acute angle.

The first passivation film may include a first passivation portion and a second passivation portion. The second passivation portion may be positioned between the first passivation portion and the substrate and may directly contact the metal pad. The first passivation portion may be positioned beyond the metal pad in a second direction and may not directly contact the metal pad. The second direction may be perpendicular to the face of the substrate.

The first passivation film may include a first passivation portion and a second passivation portion. The second passivation portion may be positioned between the first passivation portion and the substrate and may directly contact the metal pad. A width of the first passivation portion in the first direction may be greater than a width of the second passivation portion in the first direction.

Each of the first passivation portion and the second passivation portion may directly contact the first face of the metal pad.

The first passivation portion may be positioned beyond the metal pad in a second direction and may not directly contact the metal pad. The second direction may be perpendicular to the face of the substrate.

The display device may include a second passivation film. The second passivation film may be formed of the insulating material and may directly contact a second face of the metal pad. The second face of the metal pad may be opposite the first face of the metal pad. A space between the first passivation film and the second passivation film may at least partially expose a third face of the metal pad. A fourth face of the metal pad may be positioned between the substrate and the third face of the metal pad and may be oriented not parallel to either of the first pad of the metal pad and the second face of the metal pad. The fourth face of the metal pad may be oriented parallel to the face of the substrate.

A first edge of the third face of the metal pad may directly contact the first passivation film. A second edge of the third face of the metal pad may directly contact the second passivation film. A portion of the third face of the metal pad positioned between the first edge of the third face of the metal pad and the second edge of the third face of the metal pad may directly contact no element that is formed of the insulating material.

Each of the first passivation film and the second passivation film may be taller than the metal pad in a second direction. The second direction may be perpendicular to the face of the substrate.

Each of the first passivation film and the second passivation film may be as tall as the metal pad in a second direction. The second direction may be perpendicular to the face of the substrate.

A width of the metal pad in the first direction may be greater than a sum of a width of the first passivation film in the first direction and a width of the second passivation film in the first direction.

An embodiment may be related to a method for manufacturing a display device. The method may include the following steps: preparing a substrate; forming a transistor, which overlaps a face of the substrate; forming a metal line, which includes a line portion formed of a first metal material; forming a metal pad, which includes a pad portion formed of the first metal material, is electrically connected through the metal line to the transistor, and is wider than the metal in a first direction, wherein the first direction is parallel to the face of the substrate, and wherein a first face of the metal pad is oriented at a first acute angle or a right angle with respect to the face of the substrate; and forming a first passivation film, which is formed of an insulating material and directly contacts the first face of the metal pad.

The method may include depositing a fluorine-based gas on at least the first face of the metal pad for forming the first passivation film. The first passivation film may include and/or may be formed of a fluorine-based polymer.

DETAILED DESCRIPTION OF EMBODIMENTS

Figure 1:
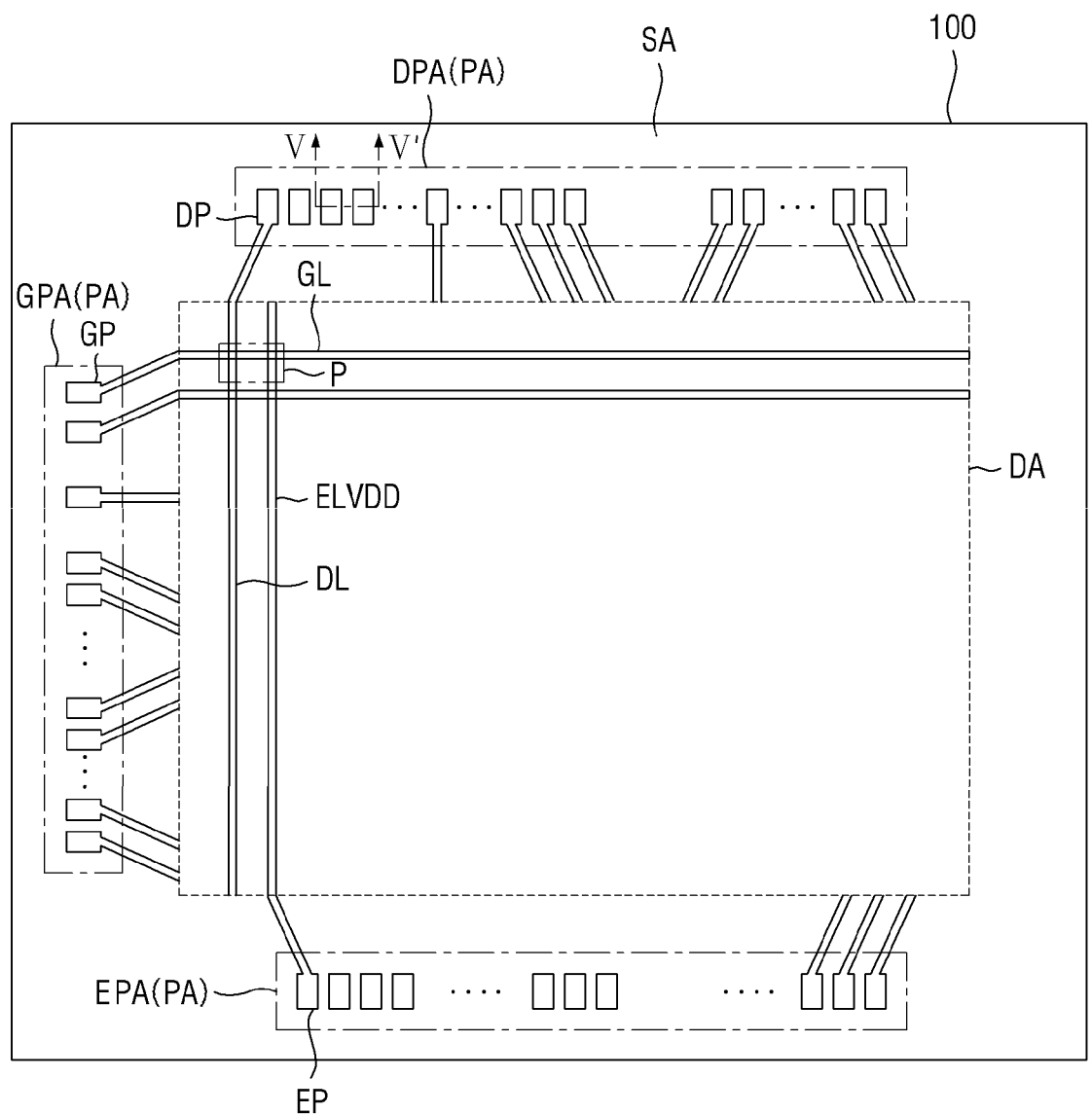
FIG. 1 is a layout diagram illustrating a display device according to an embodiment.

Example embodiments are described with reference to the accompanying drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

It will be understood that when a first element is referred to as being "on," "connected to," or "coupled to" a second element, the first element can be directly on, connected, or coupled to the second element, or one or more intervening elements may exist between the first element and the second element. In contrast, when a first element is referred to as being "directly on," "directly connected to," or "directly coupled to" a second element or layer, there are no intended intervening elements (except environmental elements such as air) present between the first element and the second element. As used herein, "connect" may mean "physically connect," "electrically connect." and/or "fluidly connect".

Like numbers may refer to like elements.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" relative to other elements or features would then be oriented "above" relative to the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a," "an" and "the" may include the plural forms as well, including "at least one," unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof. The term "pattern layer" may represent one or more members. The term "contain" may mean "be made of".

FIG. 1 is a layout diagram illustrating a display device according to an embodiment.

Referring to FIG. 1, the display device includes a substrate 100, a plurality of gate lines GL disposed on the substrate 100 and extending in a first direction D1, and a plurality of data lines DL and a plurality of driving voltage lines ELVDD disposed on the substrate, insulated from each of the gate lines GL, and extending in a second direction D2 intersecting (i.e., different from) the first direction D1.

The display device includes a display area and a non-display area around the display area in planar view. The aforementioned gate lines GL, data lines DL and driving voltage lines ELVDD are arranged over the non-display area and the display area.

The display area of the display device includes a plurality of pixels P. Each of the pixels P may be disposed in a region where the gate line GL intersects the data line DL.

The non-display area is disposed around at least one side of the display area. For example, as shown in FIG. 1, the display area may be formed in a rectangular shape, and the non-display area may surround the display area. In an embodiment, the non-display area may be adjacent to one long side and one short side of the display area.

Then non-display area may include pad areas PA where gate pads GP, data pads DP and driving voltage pads EP are arranged. The gate pads GP, the data pads DP, and the driving voltage pads EP may make contact with external circuits, such as driving chips.

The data pads DP and the driving voltage pads EP may be respectively arranged in the non-display areas adjacent to one long side and the other side of the display area. The data pads DP are connected to the data lines DL, and the driving voltage pads EP are connected to the driving voltage lines ELVDD.

The gate pads GP may be arranged in the non-display area adjacent to one short side of the display area. The gate pads GP are connected to the gate lines GL.

In the following specification, the non-display area where the data pads DP are arranged is referred to as a data pad area DPA, the non-display area where the driving voltage pads EP are arranged is referred to as a driving voltage pad area EPA, and the non-display area where the gate pads GP are arranged is referred to as a gate pad area GPA.

The data pad DP may be connected with the end of the data line DL extending from a pixel area DA. The data pad DP may be formed to have a larger width than the data line DL, and may have a rectangular shape having long sides in the second direction D2.

The driving voltage pad EP may be connected with the end of the driving voltage line ELVDD extending from the pixel area DA. Similarly, the driving voltage pad EP may be formed to have a larger width than the driving voltage line ELVDD, and may have a rectangular shape having long sides in the second direction D2.

The gate pad GP may be connected with the end of the gate line GL extending from the pixel area DA. The gate pad GP may be formed to have a larger width than the gate line GL, and may have a rectangular shape having long sides in the first direction D1.

A protective layer 180, a light-emitting device LD, and a pixel defining film 200 may be disposed on the data lines DL and driving voltage lines ELVDD of the pixel area DA, but all or some of the above structures may not be disposed on the data pads DP and the driving voltage pads EP. Therefore, all or some of the data lines DL and driving voltage lines ELVDD respectively connected with the data pads DP and driving voltage pads EP may be exposed by the above structures.

An interlayer insulating layer 160, data lines DL, driving voltage lines ELVDD, a protective layer 180, a light-emitting device LD, and a pixel defining film 200 may be disposed on the gate lines GL of the pixel area DA, but all or some of the above structures may not be disposed on the gate pads GP. Therefore, all or some of the gate lines GL connected with the gate pads GP may be exposed by the above structures.

The driving voltage line ELVDD may be made of the same material as the data line DL, and the driving voltage pad EP may be made of the same material as the data pad DP.

Figure 2:
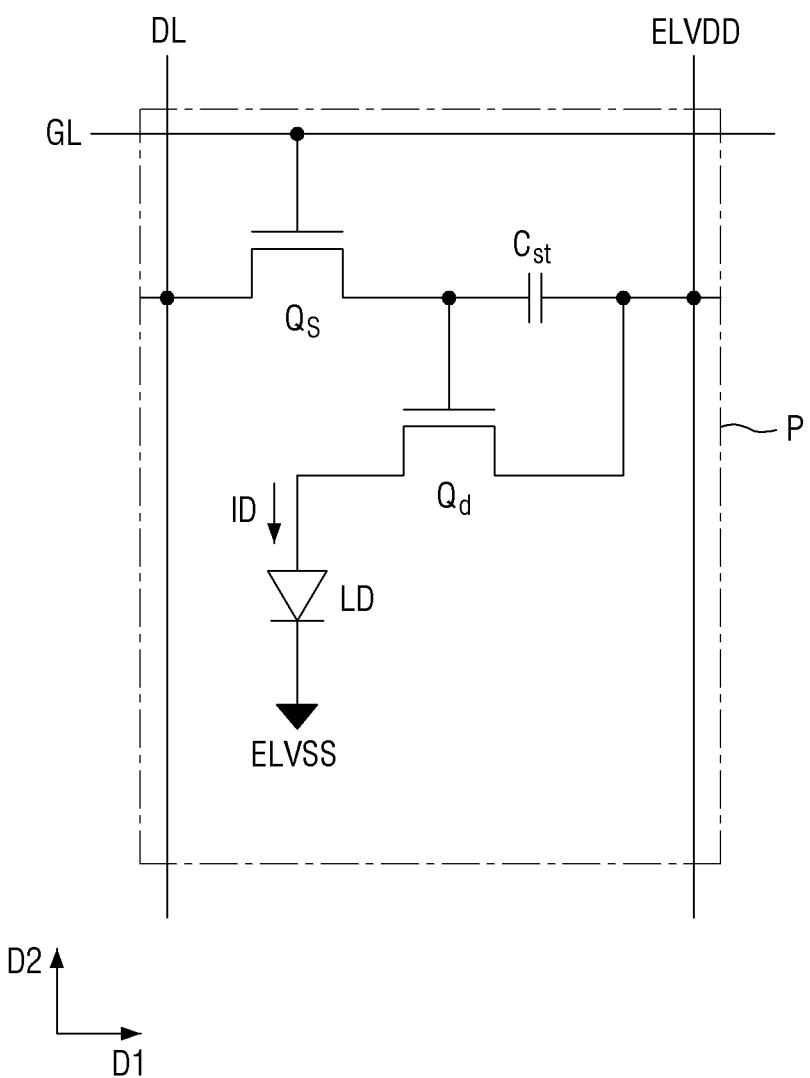
FIG. 2 is an equivalent circuit diagram of a pixel of FIG. 1 according to an embodiment.

FIG. 2 is an equivalent circuit diagram of the pixel of FIG. 1 according to an embodiment.

Referring to FIG. 2, each pixel may include a switching thin film transistor Qs, a driving thin film transistor Qd, a capacitor Cst, and a light-emitting device LD.

The switching thin film transistor Qs includes a control terminal, an input terminal, and an output terminal. The control terminal is connected to the gate line GL, the input terminal is connected to the data line DL, and the output terminal is connected to the control terminal of the driving thin film transistor Qd. The switching thin film transistor Qs transmits a data signal applied to the data line DL to the control terminal of the driving thin film transistor Qd in response to a gate signal applied to the gate line GL.

The driving thin film transistor Qd also includes a control terminal, an input terminal, and an output terminal. The control terminal of the driving thin film transistor Qd is connected to the output terminal of the switching thin film transistor Qs, the input terminal thereof is connected to the driving voltage line ELVDD, and the output terminal thereof is connected to the light-emitting device LD. The driving thin film transistor Qd transmits output current ID, the intensity of which is changed depending on the voltage applied between the control terminal and the input terminal, to the light-emitting device LD.

The capacitor Cst is connected between the control terminal (simultaneously, output terminal of switching thin film transistor Qs) and input terminal of the driving thin film transistor Qd. The capacitor Cst is discharged with the data signal provided from the switching thin film transistor Qs, and is maintained in this state even after the switching thin film transistor Qs turns off.

The light-emitting device LD may be an organic light-emitting device. The light-emitting device LD includes an anode electrode 191a, a light-emitting layer 201, and a cathode electrode 210. The anode electrode 191a of the light-emitting device LD may be a pixel electrode, and the cathode electrode 210 thereof may be a common electrode. The anode electrode 191a of the light-emitting device LD is connected to the output terminal of the driving thin film transistor Qd, and the cathode electrode 210 thereof is connected to the common voltage. The light-emitting layer 201 emits light with different intensity depending on the output current ID of the driving thin film transistor Qd, thereby displaying an image.

The connection relationship among the switching thin film transistor Qs, the driving thin film transistor Qd, the capacitor Cst and the light emitting device LD may be changed as needed.

Hereinafter, the structure of the aforementioned display device will be described in more detail.

Figure 3:
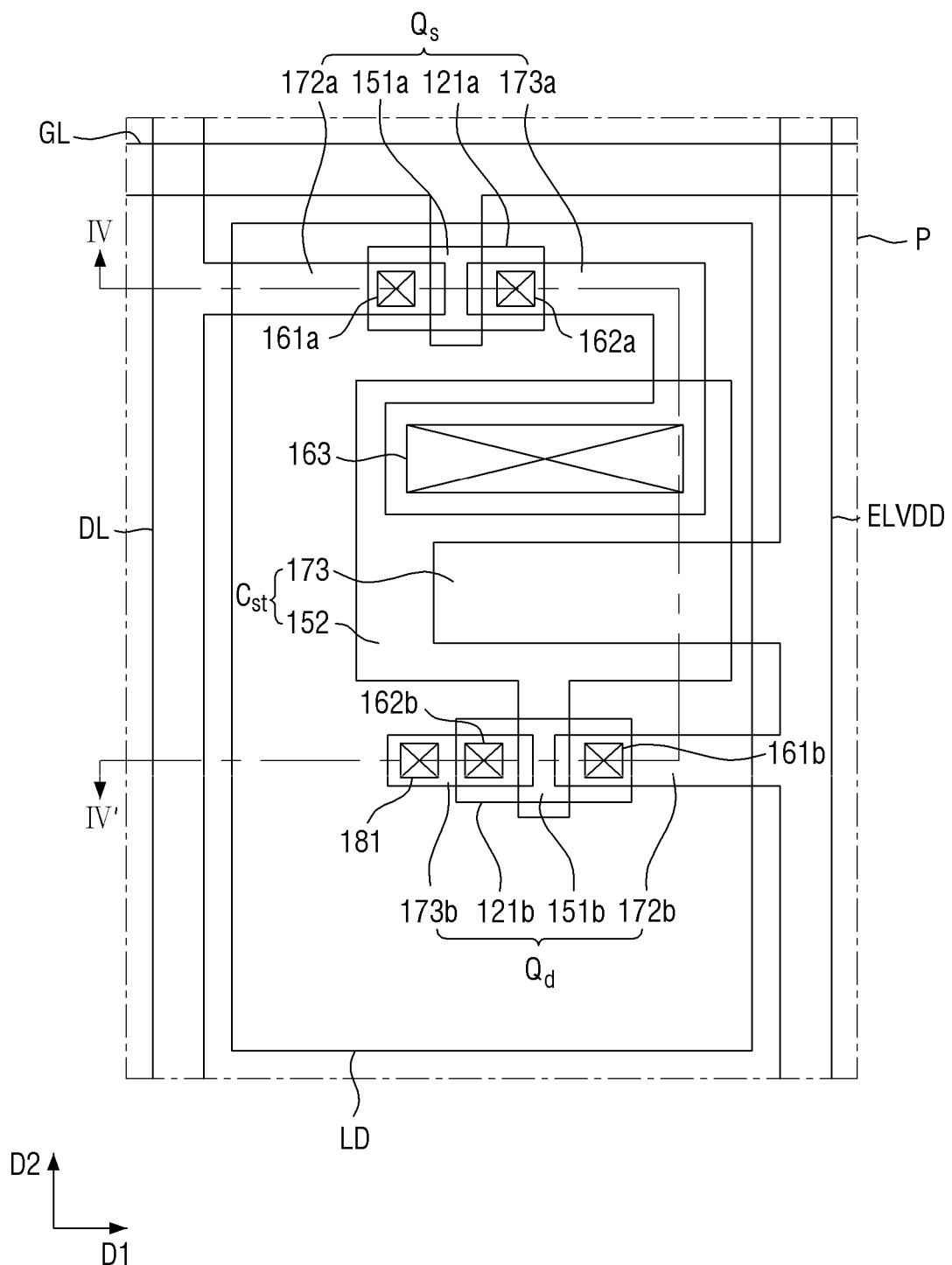
FIG. 3 is a layout diagram of a pixel of FIG. 1 according to an embodiment.
Figure 4:
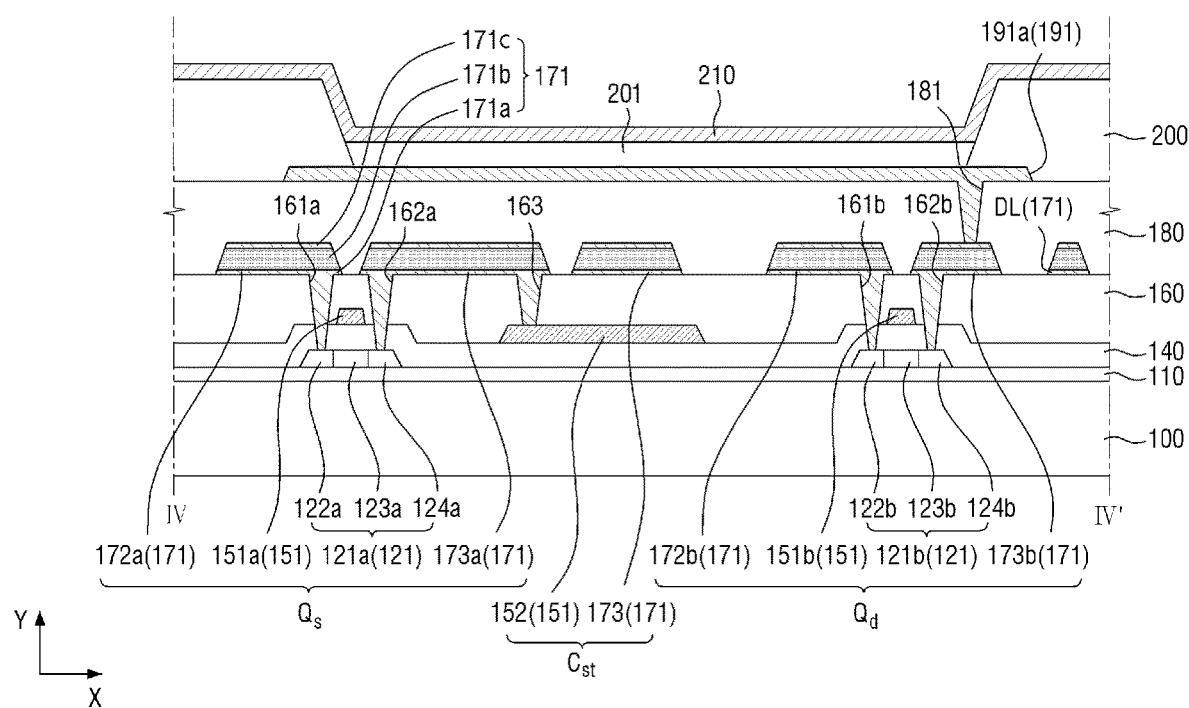
FIG. 4 is a cross-sectional view taken along the line IV-IV' of FIG. 3 according to an embodiment.
Figure 5:
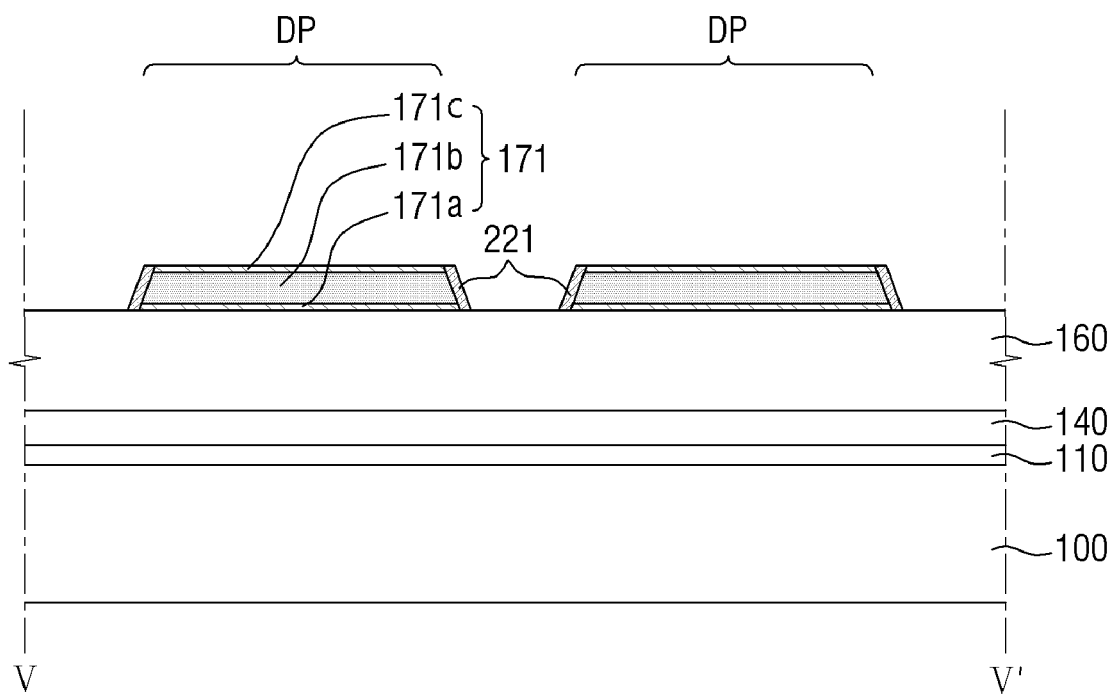
FIG. 5 is a cross-sectional view taken along the line V-V' of FIG. 1 according to an embodiment.

FIG. 3 is a layout diagram of the pixel of FIG. 1, FIG. 4 is a cross-sectional view taken along the line IV-IV' of FIG. 3, and FIG. 5 is a cross-sectional view taken along the line V-V' of FIG. 1 according to one or more embodiments.

Referring to FIGS. 1 and 3 to 5, the display device includes a substrate 100, a buffer layer 110, an active pattern layer 121, a gate insulating layer 140, a first metal pattern layer 151, an interlayer insulating layer 160, a second metal pattern layer 171, a protective layer 180, a third metal pattern layer 191, a pixel defining film 200, a light-emitting layer 201, and a cathode electrode 210.

The substrate 100 may contain transparent glass or plastic.

The buffer layer 110 may be disposed on the substrate 100 of the pixel area DA and the pad area PA.

The buffer layer 110 may contain silicon nitride ($SiN_x$), silicon oxide ($SiO_x$), or silicon oxynitride ($SiO_xN_y$), and may be a single layer or a multi-layer. The buffer layer 110 serve to prevent the penetration of impurities, water or air that degrades the characteristics of semiconductor and to planarize a surface. The buffer layer 110 may be omitted.

The active pattern layer 121 may be disposed on the buffer layer 110 of the pixel area DA. The active pattern layer 121 may include a switching semiconductor 121a and a driving semiconductor 121b, and may be made of polysilicon.

The switching semiconductor 121a and driving semiconductor 121b may include channel regions 123a and 123b, source regions 122a and 122b adjacent to the channel regions 123a and 123b, and drain regions 124a and 124b adjacent to the channel regions 123a and 123b. The channel regions 123a and 123b may be made of an intrinsic semiconductor which is a polysilicon not doped with impurities, and the source regions 122a and 122b and the drain regions 124a and 124b may be made of an impurity semiconductor which is a polysilicon doped with impurities.

The gate insulating layer 140 may be disposed on the active pattern layer 121 of the pixel area DA and the buffer layer 110 of the pad area PA. The gate insulating layer 140 may contain silicon nitride, silicon oxide, or silicon oxynitride, and may be a single layer or a multi-layer.

The first metal pattern layer 151 may be disposed on the gate insulating layer 140 of the pixel area DA and the pad area PA. The first metal pattern layer 151 may contain aluminum (Al), molybdenum (Mo), copper (Cu), or an alloy thereof, and may have a multi-layer structure.

The first metal pattern layer 151 may include a gate line GL, a plurality of switching gate electrodes 151a branched from the gate line GL, a first capacitor plate 152, and a driving gate electrode 151b connected with the first capacitor plate 152.

The gate line GL may extend in the first direction D1 to be disposed on one side of the pixel. The gate line GL transmits a gate signal.

The switching gate electrode 151a protrudes toward the switching semiconductor 121a from the gate line GL.

The driving gate electrode 151b is disposed to be spaced apart from the gate line GL and the switching gate electrode 151a. The switching gate electrode 151a and the driving gate electrode 151b respectively overlap the channel regions 123a and 123b of the switching semiconductor 121a and the driving semiconductor 121b.

The first capacitor plate 152 is connected with the driving gate electrode 151b. The first capacitor plate 152 is connected with a switching drain electrode 173a through a first contact hole 163.

The first metal pattern layer 151 may include a gate pad GP in the pad area PA. The gate pad GP is connected with the end of the gate line GL.

The interlayer insulating layer 160 is disposed on the first metal pattern layer 151 of the pixel area DA and the pad area PA. The interlayer insulating layer 160 may contain silicon nitride, silicon oxide, or silicon oxynitride, and may be a single layer or a multi-layer.

A switching source contact hole 161a and a switching drain contact hole 162a, through which the source region 122a and drain region 124a of the switching semiconductor 121a are respectively exposed, may be formed in the gate insulating layer 140 and the interlayer insulating layer 160 to penetrate the gate insulating layer 140 and the interlayer insulating layer 160. Similarly, a driving source contact hole 161b and a driving drain contact hole 162b, through which the source region 122b and drain region 124b of the driving semiconductor 121b are respectively exposed, may be formed in the gate insulating layer 140 and the interlayer insulating layer 160 to penetrate the gate insulating layer 140 and the interlayer insulating layer 160.

The second metal pattern layer 171 may be disposed on the interlayer insulating layer 160 of the pixel area DA and the pad area PA. The second metal pattern layer 171 may contain aluminum (Al), molybdenum (Mo), chromium (Cr), tantalum (Ta), titanium (Ti) and other refractory metals, or an alloy thereof, and may have a multi-layer structure.

For example, the second metal pattern layer 171 may have a triple layer structure including a lower auxiliary metal layer 171a located at the lowermost portion of the second metal pattern layer 171, a main metal layer 171b disposed on the lower auxiliary metal layer 171a, and an upper auxiliary metal layer 171c disposed on the main metal layer 171b. The main metal layer 171b may contain aluminum, and the lower and upper auxiliary metal layers 171a and 171c may contain titanium.

The second metal pattern layer 171 may include a data line DL, a driving voltage line ELVDD, a switching drain electrode 173a, and a driving drain electrode 173b.

The data line DL extends in the second direction D2 intersecting the gate line GL to transmit a data signal. The switching source electrode 172a protrudes toward the switching semiconductor 121a from the data line DL.

The driving voltage line ELVDD is separated from the data line DL, and extends in the same direction as the data line DL to transmit a driving signal. The data line DL and the driving voltage line ELVDD may be separated from each other, and may be located at both sides of the pixel.

The second metal pattern layer 171 may include a driving source electrode 172b protruding toward the driving semiconductor 121b from the driving voltage line ELVDD and a second capacitor plate 173 protruding from the driving voltage line ELVDD to overlap the first capacitor plate 152. The first capacitor plate 152 and the second capacitor plate 173 may constitute the capacitor Cst by using the interlayer insulating layer 160 as a dielectric.

The switching drain electrode 173a may face the switching source electrode 172a, and the driving drain electrode 173b may face the driving source electrode 172b.

The switching drain electrode 173a and the switching source electrode 172a may be respectively connected to the drain region 124a and source region 122a of the switching semiconductor 121a through the switching drain contact hole 162a and the switching source contact hole 161a. The driving drain electrode 173b and the driving source electrode 172b may be respectively connected to the drain region 124b and source region 122b of the driving semiconductor 121b through the driving drain contact hole 162b and the driving source contact hole 161b.

The switching drain electrode 173a may also be electrically connected with the first capacitor plate 152 and the driving gate electrode 151b through the first contact hole 163 formed by penetrating the interlayer insulating layer 160.

The switching semiconductor 121a, the switching gate electrode 151a, the switching source electrode 172a, and the switching drain electrode 173a may constitute the switching thin film transistor Qs. The driving semiconductor 121b, the driving gate electrode 151b, the driving source electrode 172b, and the driving drain electrode 173b may constitute the driving thin film transistor Qd.

The second metal pattern layer 171 may include a data pad DP and driving voltage pad EP in the pad region PA. The data pad DP and the driving voltage pad EP are respectively connected with the ends of the data line DL and driving voltage line ELVDD extending from the pixel area DA. The side walls of the data pad DP and the driving voltage pad EP may be exposed while not being at least partially covered by the protective layer 180.

A passivation film 221 may be disposed on the side walls of the second metal pattern layer 171 of the pad area PA, that is, the data pad DP and the driving voltage pad EP. Since the reduction potential of the passivation film 221 is different from that of the metal contained in the second metal pattern layer 171, the metal capable of causing a galvanic reaction is reduced, so as to prevent the pad from being shorted.

The passivation film 221 may contain a fluorine (F)-based polymer. The fluorine (F)-based polymer may include a fluorocarbon ($C_xF_y$) group or a fluorohydrocarbon ($C_xH_yF_z$) group. Examples of the fluorocarbon and fluorohydrocarbon groups may include —$CF_3$, —$CF_2$—, and —CHF—.

The passivation film 221 may be formed to cover all the side walls of the second metal pattern layer 171, and is not limited to the arrangement direction of the side walls.

The passivation film 221 may be formed on only the side walls of the second metal pattern layer 171, and the entire upper surface of the second metal pattern layer 171 may be exposed. In an embodiment, the passivation film 221 may be formed to cover a part of the upper surface of the second metal pattern layer 171 or the entire upper surface thereof, and may also be formed to expose a part of the side wall of the second metal pattern layer 171.

When the second metal pattern layer 171 has a multi-layer structure, the passivation film 221 may be formed on the side walls of all the layers included in the second metal pattern layer 171, but may be formed on only the side walls of some of the layers included in the second metal pattern layer 171.

For example, as described above, when the second metal pattern layer 171 includes the main metal layer 171b and the lower and upper auxiliary metal layers 171a and 171b disposed on and beneath the main metal layer 171b, the passivation film 221 may be formed on the side walls of the main metal layer 171b and the lower and upper auxiliary metal layers 171a and 171b. In an embodiment, the passivation film 221 may be formed on only the side walls of the main metal layer 171b or the lower and upper auxiliary metal layers 171a and 171b, and may also be formed on only the side walls of the main metal layer 171b and the lower or upper auxiliary metal layers 171a or 171b.

The passivation film 221 may be formed to have a thickness of 10 nm to 150 nm. The passivation film 221 may be formed such that the thickness thereof is uniform, not uniform or the upper and lower thicknesses are different from each other.

Although not shown in the drawings, the passivation film 221 may be formed on not only the side wall of the second metal pattern layer 171 of the pad area PA but also the side wall of the second metal pattern layer 171 of a surrounding area SA excluding the pad area PA. Moreover, the passivation film 221 may also be formed on the side wall of the second metal pattern layer 171 of the pixel area DA.

The protective layer 180 may be disposed on the second metal pattern layer 171 of the pixel area DA and the pad area PA. The protective layer 180 may contain silicon nitride, silicon oxide, silicon oxynitride, an acryl-based organic compound having a low dielectric constant, benzocyclobutane (BCB), or perfluorocyclobutane (PFCB).

The protective layer 180 serves to protect the second metal pattern layer 171, and may also serve as a planarization film for planarizing the upper surface of the second metal pattern layer 171. A second contact hole 181 serving to expose the driving drain electrode 173b of the driving thin film transistor Qd may be formed in the protective layer 180 to penetrate the protective layer 180.

The third metal pattern layer 191 may be disposed on the protective layer 180 of the pixel area DA, and may include an anode electrode 191a. The anode electrode 191a may be electrically connected with the driving drain electrode 173b of the driving thin film transistor Qd through the second contact hole 181 formed in the protective layer 180, and may be an pixel electrode of the light-emitting device LD.

The third metal pattern layer 191 may include a material layer having a high work function, which made of ITO, IZO, ZnO, or $In_2O_3$. Moreover, the third metal pattern layer 191 may be a laminate film of the aforementioned material layer having a high work function and a reflective metal layer made of lithium (Li), calcium (Ca), lithium fluoride/calcium (LiF/Ca), lithium fluoride/aluminum (LiF/Al), aluminum (Al), silver (Ag), magnesium (Mg), or gold (Au).

The second metal pattern layer 171 and the third metal pattern layer 191 may contain a material that can cause a galvanic reaction by a reduction potential difference. In the case of a multi-layer structure, the main metal layer 171b of the second metal pattern layer 171 and the third pattern layer 191 may contain materials that can cause a galvanic reaction. For example, the main metal layer 171b of the second metal pattern layer 171 may contain aluminum (Al), and the third pattern layer 191 may contain silver (Ag).

The pixel defining film 200 is disposed on the third metal pattern layer 191, and may contain a resin, such as polyacrylate or polyimide. The pixel defining film 200 may contain an opening for exposing the anode electrode 191a.

The light-emitting layer 201 may be disposed on the anode electrode 191a exposed through the opening of the pixel defining film 200. In the case of an organic light-emitting device LD, the light-emitting layer 201 may be a multi-layer including an organic light-emitting layer (EML) and one or more of a hole injection layer (HIL), a hole transport layer (HTL), an electron transport layer (ETL), and an electron injection layer (EIL).

The cathode electrode 210 may be disposed on the pixel defining film 200 and the light-emitting layer 201. The cathode electrode 210 may contain Li, Ca, LiF/Ca, LiF/Al, Al, Mg, Ag, Pt, Pd, Ni, Au Nd, Ir, Cr, BaF, Ba, or a compound or mixture (for example, a mixture of Ag and Mg). The cathode electrode 210 may further include an auxiliary electrode. The auxiliary electrode may include a film formed by the deposition of the above material and a metal oxide applied on the film. Examples of the metal oxide may include indium-tin-oxide (ITO), indium-zinc-oxide (IZO), zinc oxide (ZnO), and indium-tin-zinc-oxide. The cathode electrode 210 may be a common electrode of the light-emitting device LD.

In an embodiment, as shown in FIG. 5, in the pad area PA, unlike the pixel area DA, the protective layer 180 and third metal pattern layer 191 disposed on the second metal pattern layer 171 are partially or entirely removed. Therefore, the second metal pattern layer 171 is exposed to make contact with an external circuit such as a driving chip.

Figure 6:
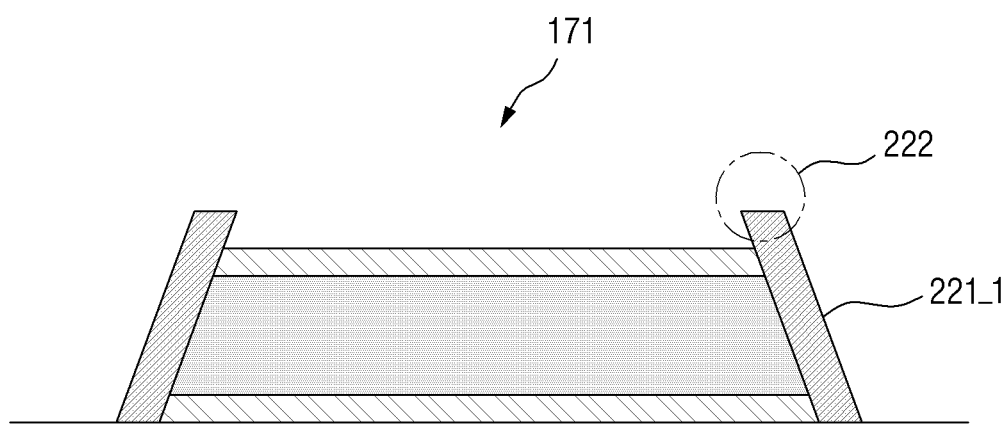
FIG. 6, FIG. 7, and FIG. 8 are cross-sectional views of metal pattern layers and passivation films covering side walls of metal pattern layers according to embodiments.
Figure 7:
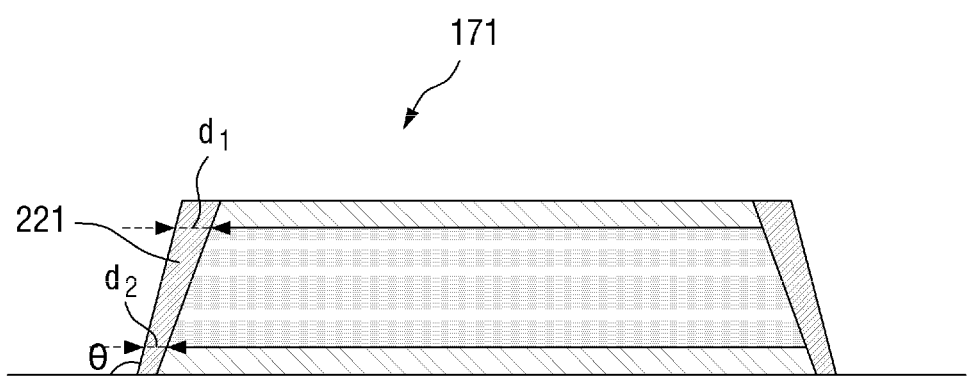
Figure 8:
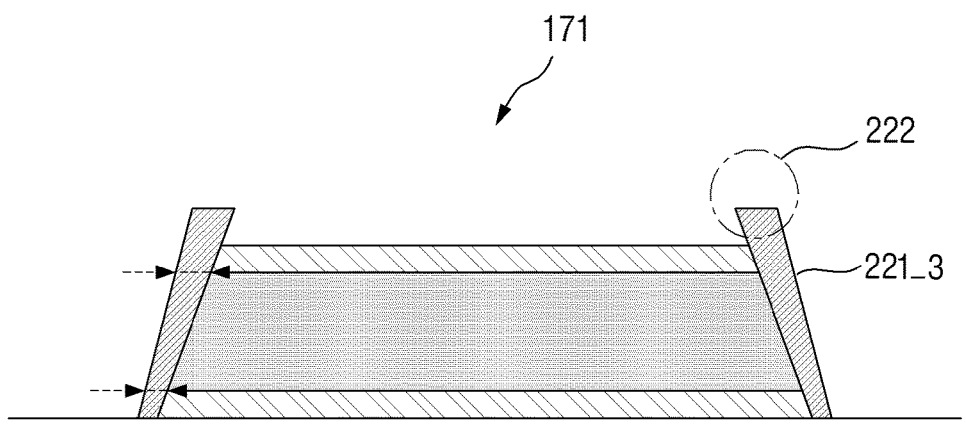

FIGS. 6 to 8 are cross-sectional views of second metal pattern layers and passivation films covering the side walls thereof according to one or more embodiments.

It is illustrated in FIG. 6 that a passivation film 221_1 further includes a protrusion 222 protruding from the second metal pattern layer 171 to a height of 50 nm to 250 nm.

FIG. 7 illustrates a case where the thickness of a passivation film 221_2 is nonuniform. For example, as shown in FIG. 7, the thickness d2 of the lower portion of the passivation film 221_2 may be smaller than the thickness d1 of the upper portion thereof. In an embodiment, the thickness of the passivation film 221_2 gradually decreases from the upper portion thereof to the lower portion thereof, or the average thickness of the lower portion thereof may be smaller than the average thickness of the upper portion thereof based on the middle point of the height of the passivation film 221_2.

In an embodiment, the angle (θ) formed between the contact surface of the layer 160 and the outer surface of the passivation film 221_2 may be a right angle or an acute angle in a range approximate to the right angle, for example, in a range of 80° to 90°.

FIG. 8 illustrates a case where the thickness of the lower portion of a passivation film 221_3 is smaller than the thickness of the upper portion thereof, and the passivation film 221_3 further includes a protrusion 222.

FIGS. 9 to 15 are cross-sectional views illustrating structures formed in a method of manufacturing a display device according to an embodiment.

Figure 9:
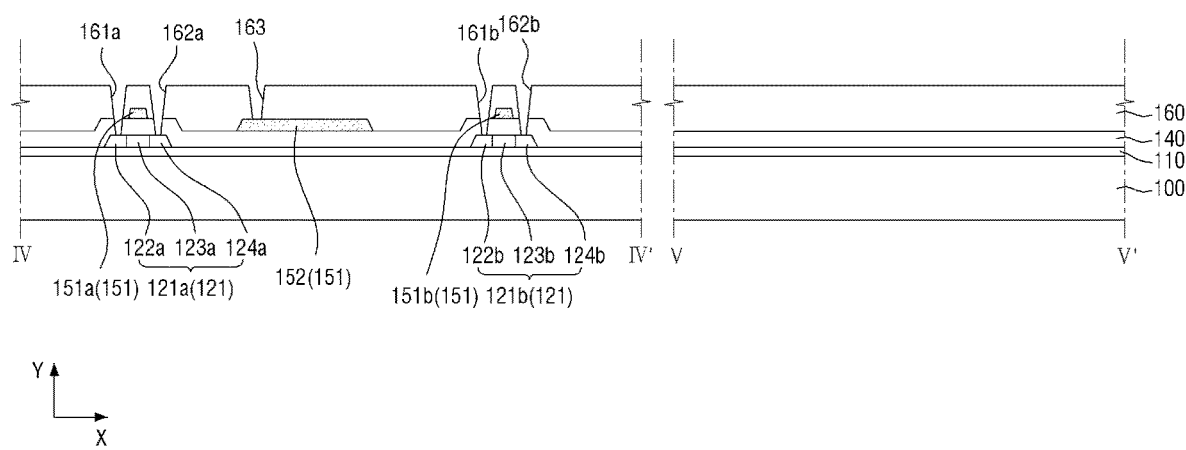
FIG. 9, FIG. 10, FIG. 11, FIG. 12, FIG. 13, FIG. 14, FIG. 15, FIG. 16, FIG. 17, FIG. 18, and FIG. 19 are cross-sectional views of structures formed in one or more methods of manufacturing a display device according to one or more embodiments.

Referring to FIG. 9, a buffer layer 110, an active pattern layer 121 including a switching semiconductor 121a and a driving semiconductor 121b, a gate insulating layer 140, a first metal pattern layer 151 including a gate line GL, and an interlayer insulating layer 160 are formed on a substrate 100. Since methods of forming the above components are commonly known in the art, specific descriptions thereof will be described in order to avoid the present invention from becoming obscure.

Subsequently, the interlayer insulating layer 160 is patterned, so as to form a switching source contact hole 161a and switching drain contact hole 162a respectively exposing a source area 122a and drain area 124a of a switching semiconductor 121a, a driving source contact hole 161b and driving drain contact hole 162b respectively exposing a source area 122b and drain area 124b of a driving semiconductor 121b, and a first contact hole 163 exposing a first capacitor plate 152.

Subsequently, referring to FIG. 10, a second metal layer 170 is formed on the interlayer insulating layer 160 of a pixel area DA and a pad area PA.

Subsequently, referring to FIG. 11, a photoresist layer PRL is formed on the second metal layer of the pixel area DA and the pad area PA.

Figure 12:
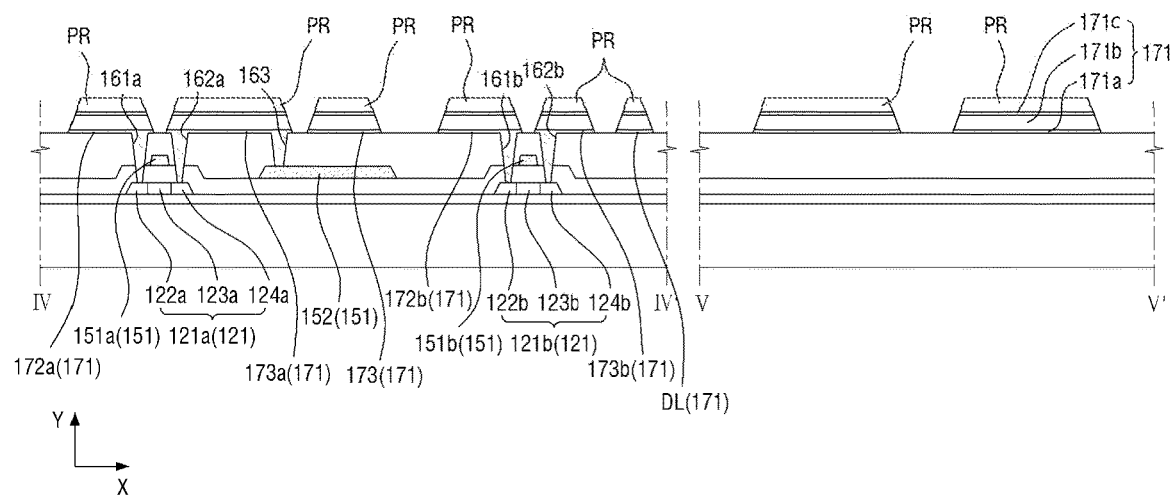

Referring to FIG. 12, subsequently, the photoresist layer PRL is exposed to light by aligning a mask, and is developed by a developer, so as to form a photoresist (PR) pattern. Subsequently, the second metal layer 170 is etched by using the photoresist (PR) pattern as an etching mask, so as to form a second metal pattern layer 171.

In an embodiment, the second metal layer 170 is etched in accordance with the pattern of the patterned photoresist layer PRL, so as to form the second meta pattern layer 171 including a data line DL, a driving voltage line ELVDD, a switching drain electrode 173a, and a driving drain electrode 173b. The photoresist PR may remain on the second metal pattern layer not having been etched.

The second metal layer 170 may be etched by dry etching using etching gas. Examples of the etching gas may include chlorine (Cl)-based gases, such as $BCl_3$, $BCl_3/Cl_2$, and/or $BCl_3/Cl_2/Ar$.

Figure 13:
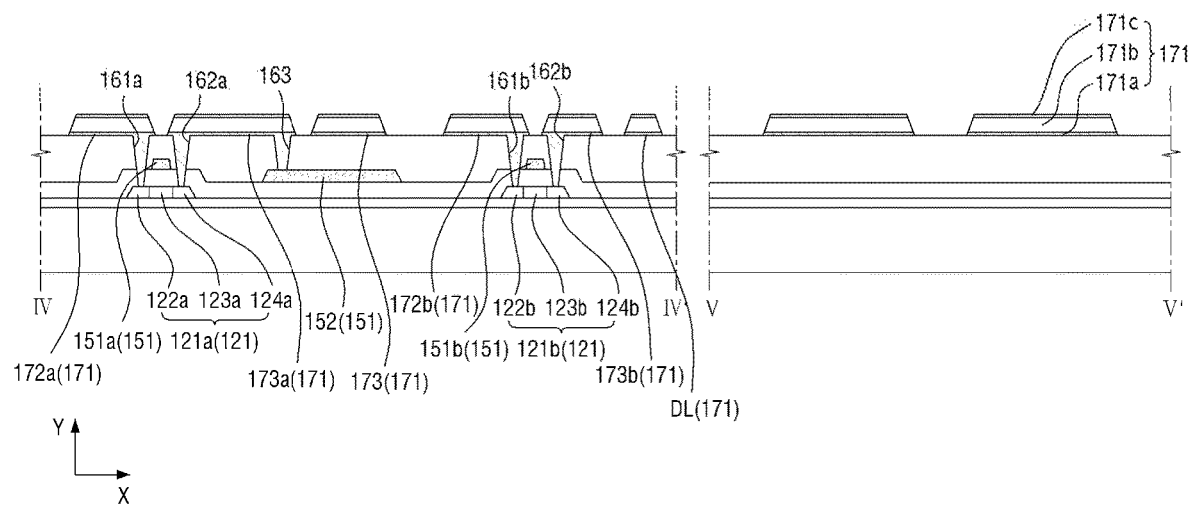

Referring to FIG. 13, the photoresist PR remaining on the second metal pattern layer 171 of the pixel area DA and the pad area PA is removed (stripped). The photoresist PR may be removed by a stripping solution (stripper), and may also be removed by lifting off or ashing.

Figure 14:
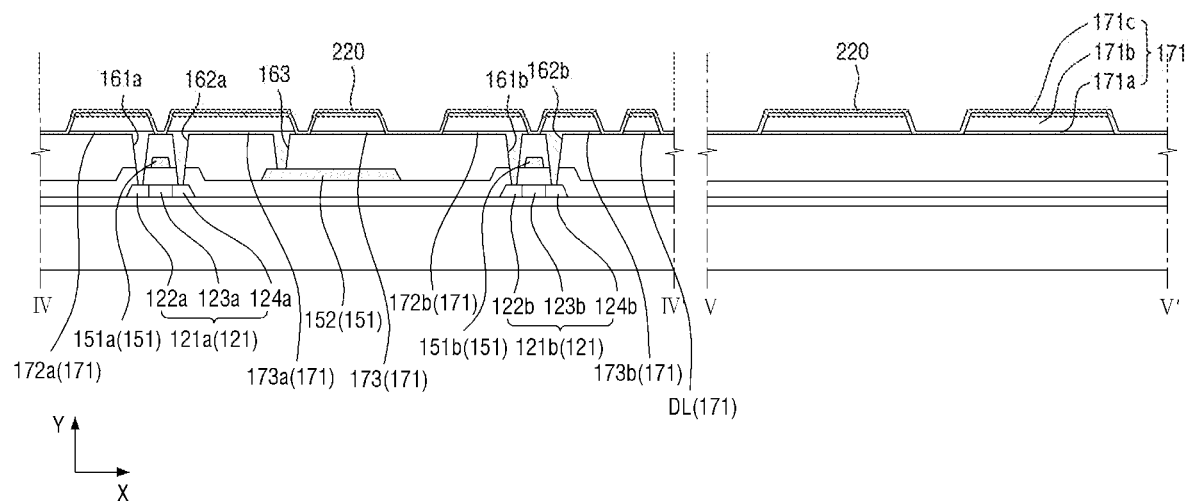

Referring to FIG. 14, subsequently, a passivation layer 220 may be formed on the second metal pattern layer 171 of the pixel area DA and the pad area PA. The passivation layer 220 may be formed by chemical vapor deposition (CVD), physical vapor deposition (PVD), or atomic layer deposition (ALD). Particularly, the passivation layer 220 may be formed by depositing fluorine (F)-based gas on the second metal pattern layer 171.

The fluorine (F)-based gas may include fluorocarbon ($C_xF_y$) and fluorohydrocarbon ($C_xH_yF_z$). Examples of fluorocarbon and fluorohydrocarbon may include $CF_4$, $C_3F_6$, $C_4F_5$, $C_5F_8$, $CHF_3$, $CH_2F_2$, $C_2HF_5$, and $CH_3F$.

Figure 15:
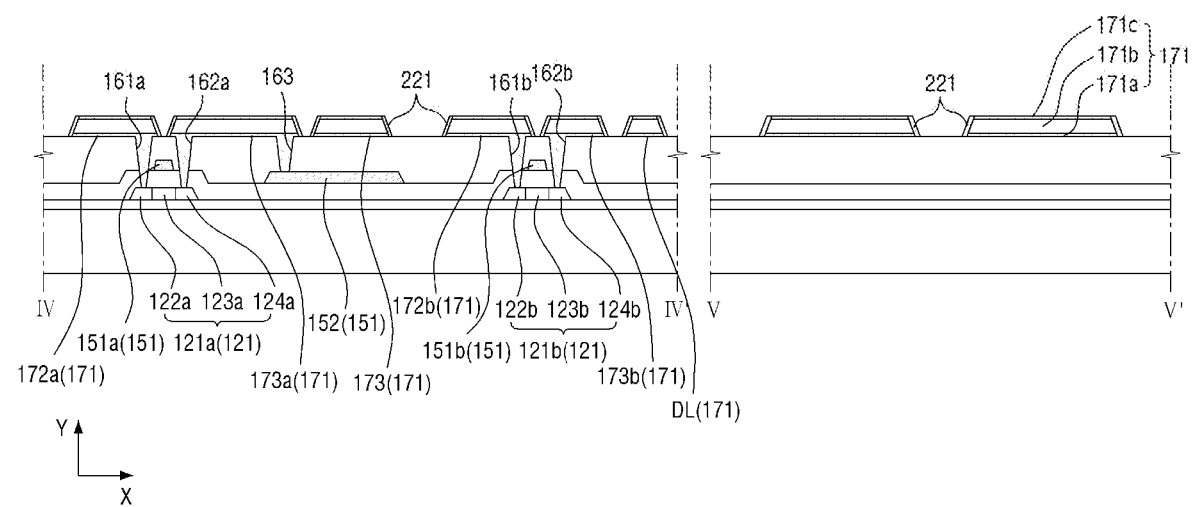

Referring to FIG. 15, a passivation film 221 may be formed on the side wall of the second metal pattern layer 171 of the pixel area DA and the pad area PA by etching the passivation layer 220. When the passivation layer 220 is etched by anisotropic etching in a vertical direction (Y), the passivation layer 220 remaining on the upper surface of the interlayer insulating layer 160 and the upper surface of the second metal pattern layer 171, excluding the passivation layer 220 (simultaneously, passivation film) remaining on the side wall of the second metal pattern layer 171, may be removed.

The passivation film 221 may contain a fluorine (F)-based polymer. The fluorine (F)-based polymer may include a fluorocarbon ($C_xF_y$) group material or a fluorohydrocarbon ($C_xH_yF_z$) group material. Examples of the fluorocarbon and fluorohydrocarbon groups may include —$CF_3$, —$CF_2$—, and —CHF—.

In the thickness of the passivation film 221, as shown in FIG. 7, the lower portion thereof is thinner than the upper portion thereof. The thickness difference may occur because the etching gas performs anisotropic etching in the vertical direction (Y) and the second metal pattern layer 171 has a truncated pyramid shape whose section is narrowed toward the upper portion thereof.

According to such a process, the passivation film 221 may be formed not only in the pad area PA but also in the surrounding area SA excluding the pad area PA and the pixel area DA.

FIGS. 9 to 11 and 16 are cross-sectional views illustrating structures formed in a method of manufacturing a display device according to an embodiment.

Figure 10:
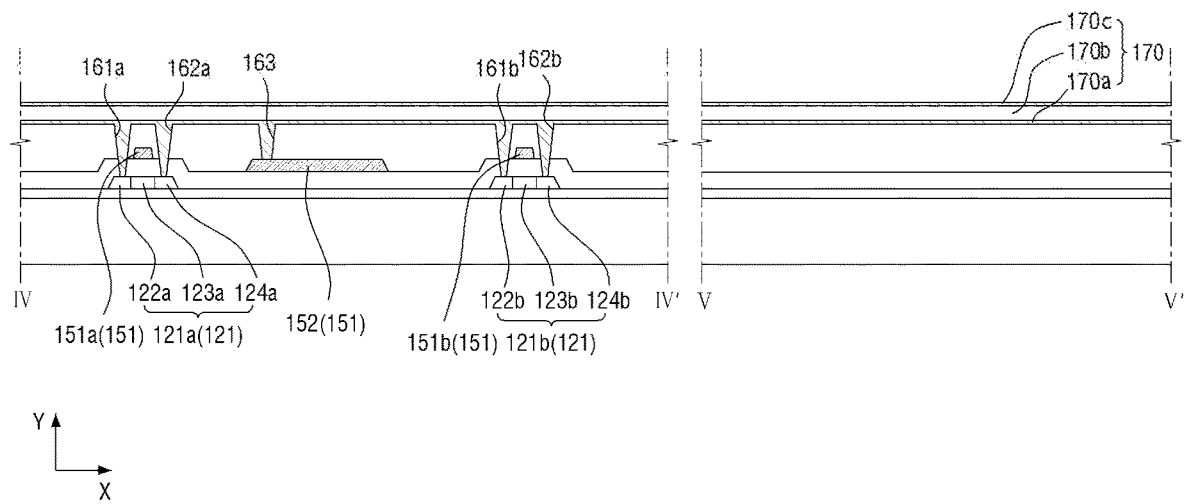
Figure 11:
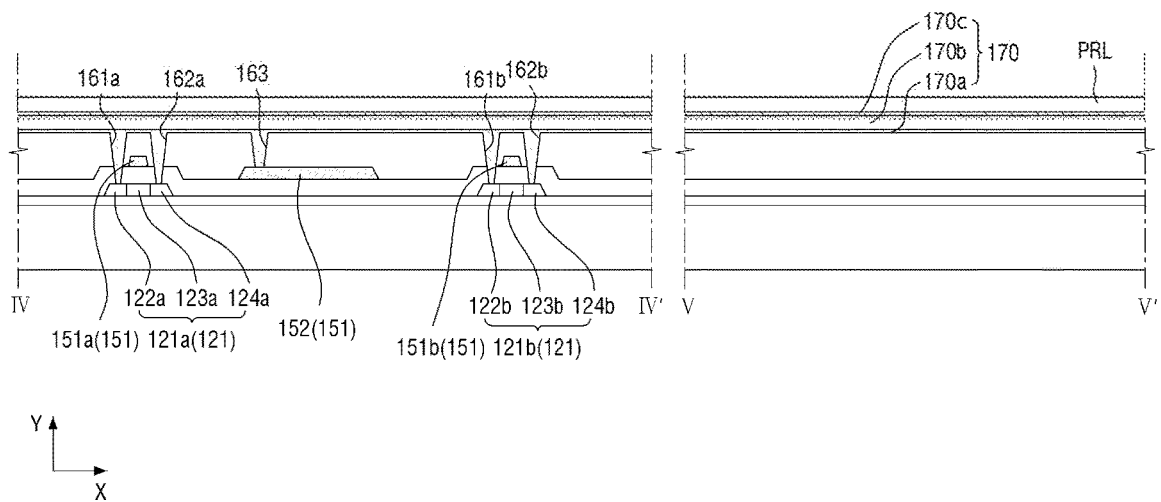
Figure 16:
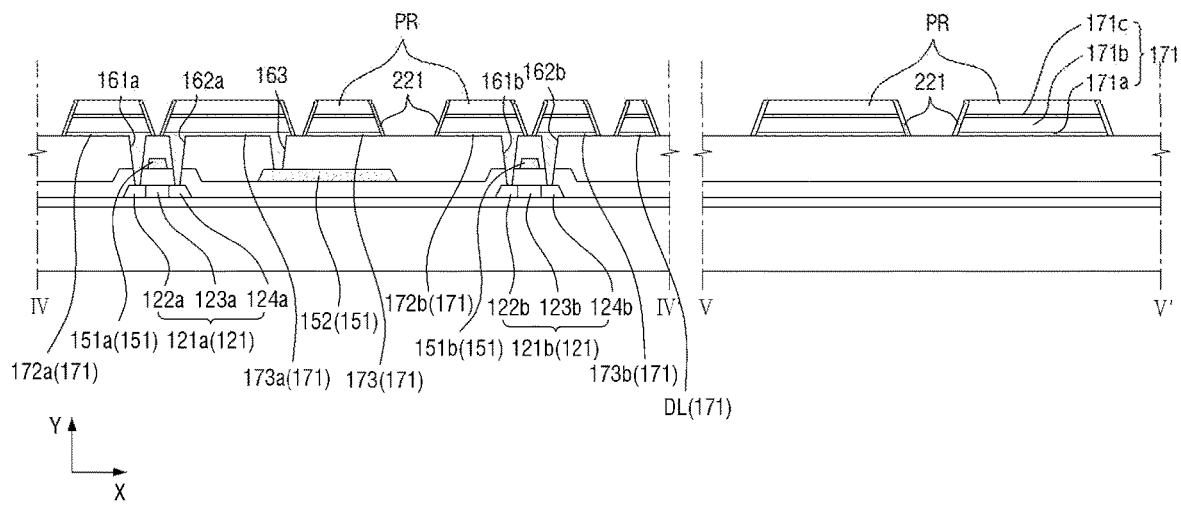

Referring to FIG. 16, after the processes of FIGS. 9 to 11, the passivation film 221 is formed on the side wall of the second metal pattern layer 171 in the pixel area DA and the pad area PA, while forming the second metal layer into the second metal pattern layer 171 by etching.

In an embodiment, when the second metal layer 170 is dry-etched and anisotropic-etched by supplying etching gas including fluorine-based gas and adjusting process conditions, the etching gas etches the second metal layer 170 in accordance with the photoresist (PR) pattern in the vertical direction (Y), and the florine-based gas forms the passivation layer 220. In this case, since the etching gas also etches the passivation layer 220 in the vertical direction (Y), only the passivation film 221 formed on the side wall of the second metal pattern layer 171 formed in the horizontal direction (X) may remain.

Examples of the etching gas may include chlorine (Cl)-based gases, such as $BCl_3$, $BCl_3/Cl_2$, and/or $BCl_3/Cl_2/Ar$.

The fluorine (F)-based gas may include fluorocarbon ($C_xF_y$) and/or fluoroydrocarbon ($C_xH_yF_z$).

Further, as shown in FIG. 15, the photoresist PR remaining on the second metal pattern layer 171 may be removed (stripped).

The passivation film 221 may also be formed on the side wall of the photoresist PR remaining on the second metal pattern layer 171. In this case, when the photoresist PR is removed by a stripping solution, the passivation film 221 formed on the side wall of the photoresist PR may be incompletely removed, and thus the protrusion 222 shown in FIG. 6 may be formed.

According to such a process, since the process of forming and etching the passivation layer 220 is not required, the passivation film 221 may be formed without an addition process. Further, the passivation film 221 may be formed not only in the pad area PA but also in the surrounding area SA excluding the pad area PA and the pixel area DA.

FIGS. 9 to 13 and 17 to 19 are cross-sectional views illustrating structures formed in a method of manufacturing a display device according to an embodiment.

Figure 17:
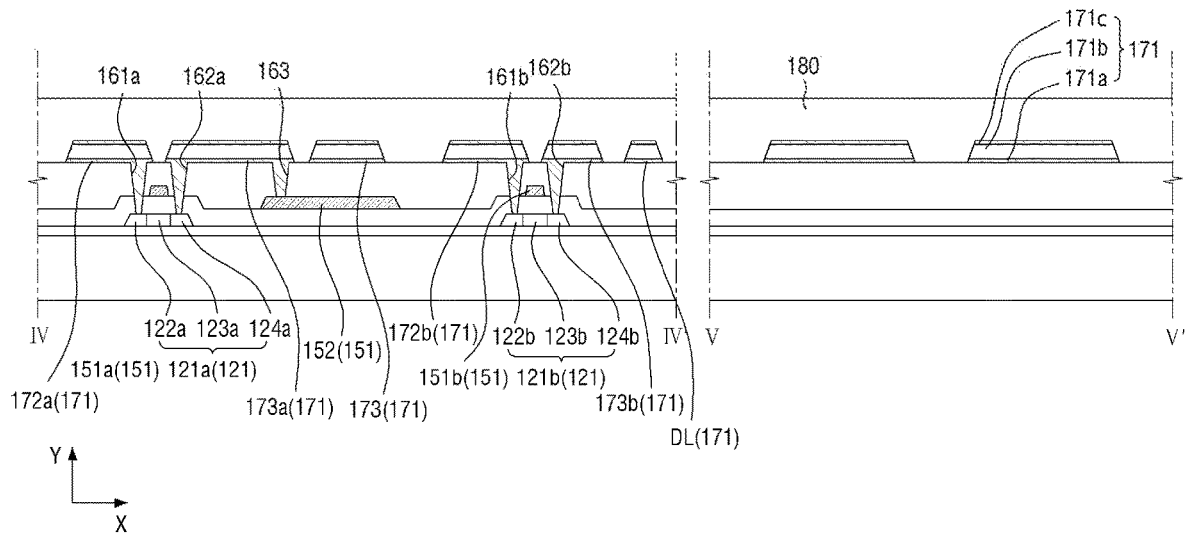

Referring to FIG. 17, after the processes of FIGS. 9 to 13, a protective layer 180 is formed on the second metal pattern layer 171 of the pixel area DA and the pad area PA.

Figure 18:
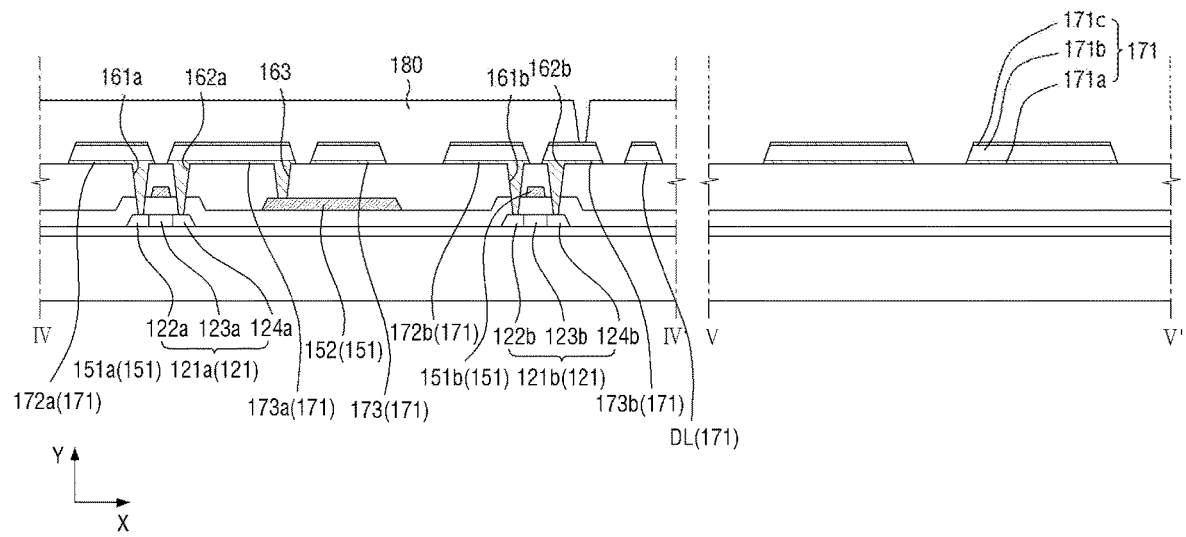

Referring to FIG. 18, the protective layer 180 is etched to expose the second metal pattern layer 171 of the pad area PA, and a second contact hole 181 for exposing the driving drain electrode 173b of the driving thin film transistor Qd is formed to penetrate the protective layer 180.

Figure 19:
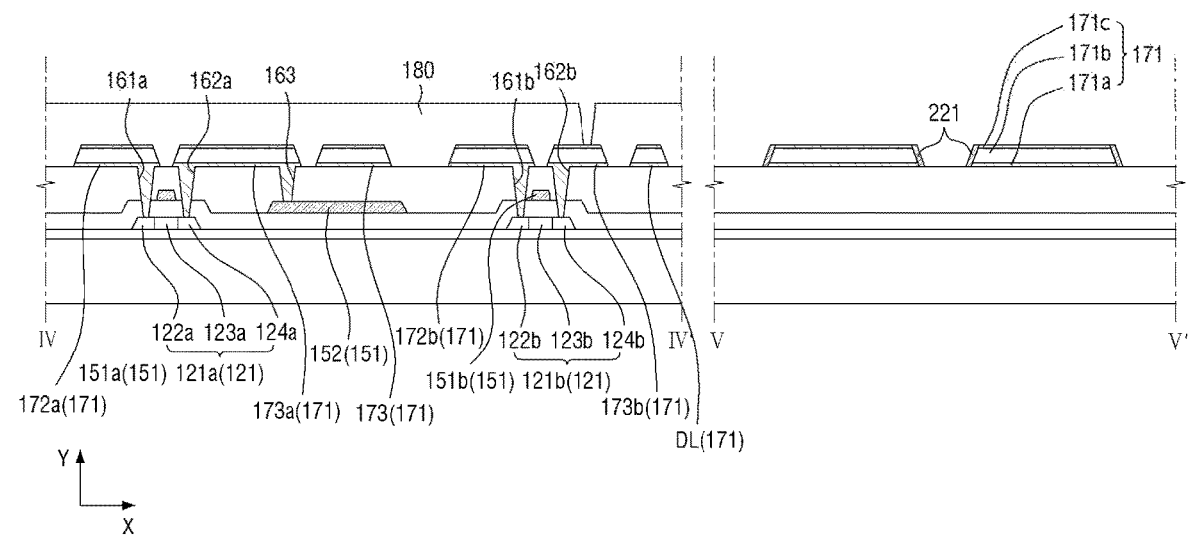

Referring to FIG. 19, a passivation film 221 is formed on the side wall of the second metal pattern layer 171 of the pad area PA. In an embodiment, as shown in FIGS. 14 and 15, a passivation layer 220 is formed on the second metal pattern layer 171, and the passivation layer 220 is etched, so as to form a passivation film 221 on the lateral side of the second metal pattern layer 171.

Although not shown in the drawings, the passivation film may be formed even on the lateral side of the protective layer 180.

In an embodiment, a third metal pattern layer 191 including an anode electrode 191a may be formed on the protective layer 180 of the pixel area DA. The second metal pattern layer 171 and the third metal pattern layer 191 may contain a material that can cause a galvanic reaction by a reduction potential difference.

Figure 20:
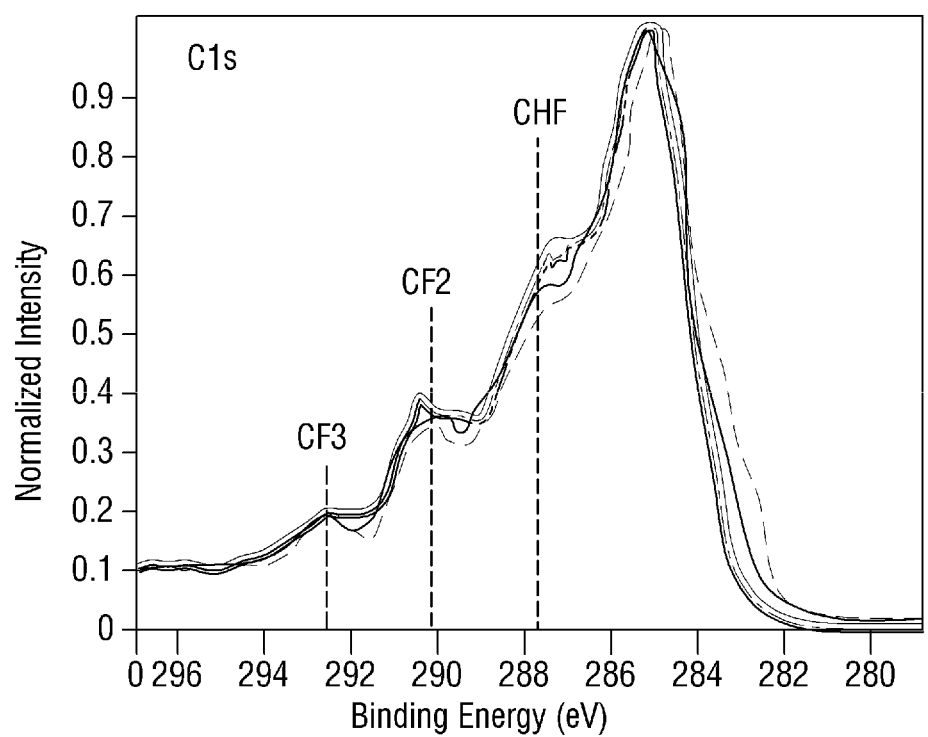
FIG. 20 is a graph showing results of analyzing a display device according to an embodiment with X-ray photoelectron spectroscopy (XPS).

FIG. 20 is a graph showing the results of analyzing the display device according to an embodiment with X-ray photoelectron spectroscopy (XPS).

Referring to FIG. 20, when manufacturing the display device, the passivation film 221 containing a fluorine-based polymer is formed, and thus a polymer containing a —$CF_3$—, —$CF_2$—, or —CHF— group may be detected.

According to embodiments, a passivation film is formed in the pad area of the display device, so as to prevent the galvanic reaction of the metal layer including a data line.

Further, according to embodiments, the passivation film can be formed with minimum processes, so as to ensure manufacturing efficiency.

Although example embodiments have been disclosed for illustrative purposes, those skilled in the art will appreciate that various modifications, additions and substitutions are possible, without departing from the scope and spirit defined in the accompanying claims.

What is claimed is:

1. A display device, comprising:
   a substrate including a display area and a non-display area which surrounds the display area and includes a pad area;
   an active pattern layer disposed on an upper surface of the substrate and disposed in the display area;
   a gate insulating layer disposed on the active pattern layer;
   a first metal pattern layer disposed on the gate insulating layer, the first metal pattern layer including a gate electrode disposed in the display area and overlapping the active pattern layer;
   an interlayer insulating layer disposed directly on the first metal pattern layer, the interlayer insulating layer disposed in the display area and the pad area;
   a second metal pattern layer disposed on an upper surface of the interlayer insulating layer, the second metal pattern layer including a source electrode disposed in the display area, a drain electrode disposed in the display area and a data pad disposed in the pad area, wherein each of the source electrode, the drain electrode and the data pad include a first surface disposed directly on the upper surface of the interlayer insulating layer, a second surface opposite to the first surface and a side surface directly connected to the first surface and the second surface;
   a passivation film disposed in the pad area, spaced from the first metal pattern layer and disposed directly on the side surface of the data pad; and
   a protective layer disposed on the second metal pattern layer,
   wherein the second metal pattern layer disposed between the interlayer insulating layer and the protective layer,
   wherein the protective layer directly contacts the side surface of the source electrode, the second surface of the source electrode, the side surface of the drain electrode and the second surface of the drain electrode,
   wherein any portion of the protective layer does not overlap the data pad in a direction perpendicular to the upper surface of the substrate,
   wherein the protective layer does not contact the second surface of the data pad, and
   wherein the passivation film does not contact any portion of the second surface of the data pad.

2. The display device of claim 1, wherein the passivation film includes a fluorine-based polymer.

3. The display device of claim 2, wherein the fluorine-based polymer includes a fluorocarbon ($C_xF_y$) group or a fluorohydrocarbon ($C_xH_yF_z$) group.

4. The display device of claim 1, further comprising:
a third metal pattern layer disposed on the protective layer and including a material, the reduction potential of the material being different from that of the second metal pattern layer.

5. The display device of claim 4, wherein the second metal pattern layer includes:
a main metal layer containing a material, the reduction potential of the material being different from that of the third metal pattern layer;
a lower auxiliary metal layer disposed beneath the main metal layer; and
an upper auxiliary metal layer disposed on the main metal layer.

6. The display device of claim 5, wherein the main metal layer contains aluminum (Al), and the third metal layer contains silver (Ag).

* * * * *